United States Patent
Schmid et al.

(10) Patent No.: US 11,411,140 B2
(45) Date of Patent: Aug. 9, 2022

(54) OPTOELECTRONIC SEMICONDUCTOR COMPONENT HAVING A CONTACT STRUCTURE, AND METHOD FOR PRODUCING A CONTACT STRUCTURE FOR AN OPTOELECTRONIC SEMICONDUCTOR COMPONENT

(71) Applicant: OSRAM OLED GMBH, Regensburg (DE)

(72) Inventors: Wolfgang Schmid, Gundelshausen (DE); Markus Bröll, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 67 days.

(21) Appl. No.: 16/635,464

(22) PCT Filed: Jul. 4, 2018

(86) PCT No.: PCT/EP2018/068142
§ 371 (c)(1),
(2) Date: Jan. 30, 2020

(87) PCT Pub. No.: WO2019/025110
PCT Pub. Date: Feb. 7, 2019

(65) Prior Publication Data
US 2021/0104645 A1    Apr. 8, 2021

(30) Foreign Application Priority Data
Aug. 3, 2017   (DE) .......................... 102017117650.0

(51) Int. Cl.
*H01L 33/38* (2010.01)
*H01L 33/00* (2010.01)
(Continued)

(52) U.S. Cl.
CPC ...... *H01L 33/382* (2013.01); *H01L 31/02161* (2013.01); *H01L 31/022408* (2013.01);
(Continued)

(58) Field of Classification Search
CPC .. H01L 33/382; H01L 33/387; H01L 33/0093
See application file for complete search history.

(56) References Cited

U.S. PATENT DOCUMENTS

2003/0064521 A1\* 4/2003 Lu .......................... G01N 31/00
436/55
2015/0084537 A1\* 3/2015 Choi ....................... H01L 33/44
315/250
(Continued)

FOREIGN PATENT DOCUMENTS

DE  102007022947 A1  10/2008
DE  102009010480 A1   9/2010
(Continued)

OTHER PUBLICATIONS

International Search Report and Written Opinion of the International Searching Authority, dated Oct. 4, 2018, in related International Application No. PCT/EP2018/068142, 15 pages.

*Primary Examiner* — Alia Sabur
(74) *Attorney, Agent, or Firm* — MH2 Technology Law Group LLP

(57) ABSTRACT

A method for producing a contact structure for an optoelectronic semiconductor component is given, comprising the steps:
 a) providing a growth substrate having a semiconductor body which is grown thereon and comprises a first and a second region, and an active region,
 b) creating at least one first recess which, starting from the second region, extends completely through the active region into the first region and does not completely penetrate the first region,
(Continued)

Figure 1E:
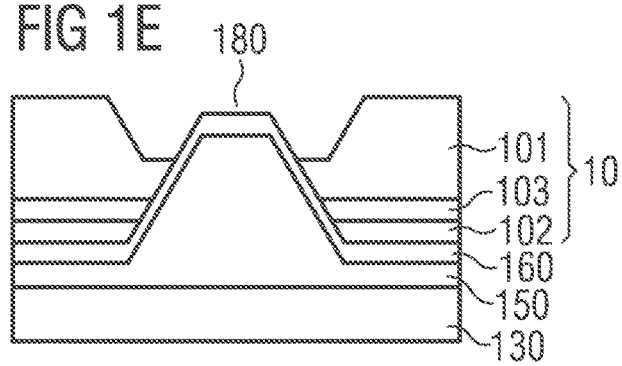

c) inserting a first electrically conductive contact material into the first recess,
d) fixing the semiconductor body with the side facing away from the growth substrate on a support substrate, and detaching the growth substrate from the semiconductor body,
e) creating at least one second recess extending from the first region to the first recess so that the first recess and the second recess form a feedthrough through the semiconductor body,
f) introducing a second electrically conductive contact material into the second recess in such a way that the first and second contact materials form an electrically conductive contact structure through the semiconductor body.

Furthermore, an optoelectronic semiconductor component with a contact structure is specified.

12 Claims, 2 Drawing Sheets

(51) Int. Cl.
*H01L 31/0216* (2014.01)
*H01L 31/0224* (2006.01)
*H01L 31/0352* (2006.01)
*H01L 31/18* (2006.01)
*H01L 33/20* (2010.01)
*H01L 33/44* (2010.01)

(52) U.S. Cl.
CPC .... *H01L 31/035281* (2013.01); *H01L 31/184* (2013.01); *H01L 31/1844* (2013.01); *H01L 33/0062* (2013.01); *H01L 33/0093* (2020.05); *H01L 33/20* (2013.01); *H01L 33/44* (2013.01); *H01L 2933/0016* (2013.01); *H01L 2933/0025* (2013.01)

(56) References Cited

U.S. PATENT DOCUMENTS

2015/0130077 A1   5/2015   Oganesian et al.
2015/0263056 A1   9/2015   Reinsma

FOREIGN PATENT DOCUMENTS

| DE | 102012112302 A1 | 6/2014 |
| EP | 2357679 A2 | 8/2011 |
| WO | 2017005829 A1 | 1/2017 |
| WO | 2017068029 A1 | 4/2017 |

* cited by examiner

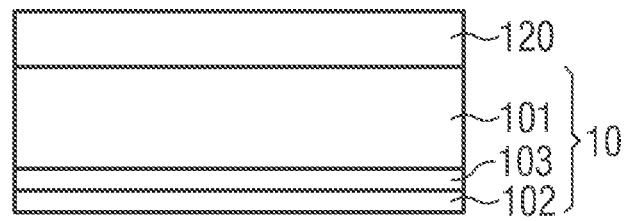
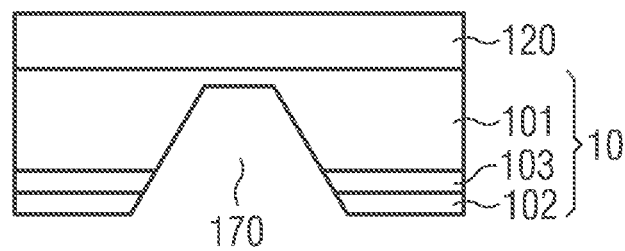
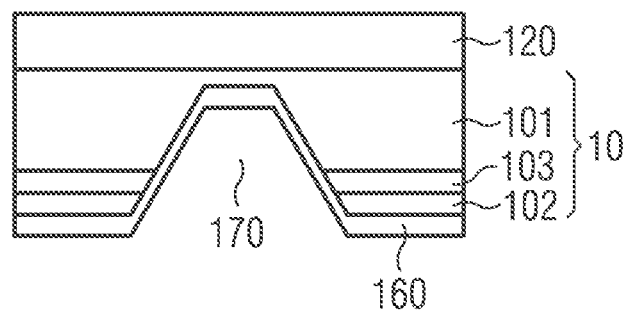
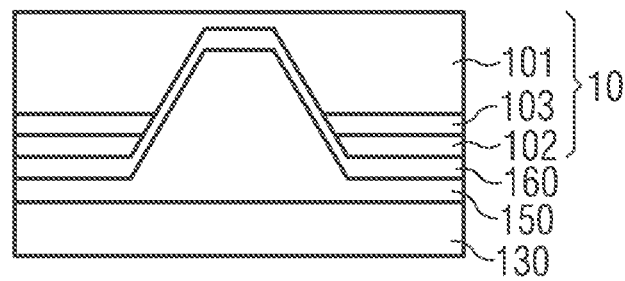

OPTOELECTRONIC SEMICONDUCTOR COMPONENT HAVING A CONTACT STRUCTURE, AND METHOD FOR PRODUCING A CONTACT STRUCTURE FOR AN OPTOELECTRONIC SEMICONDUCTOR COMPONENT

CROSS-REFERENCE TO RELATED APPLICATION(S)

This application is a national stage entry from International Application No. PCT/EP2018/068142, filed on Jul. 4, 2018, published as International Publication No. WO 2019/025110 A1 on Feb. 7, 2019, and claims priority under 35 U.S.C. § 119 from German Patent Application No. 102017117650.0, filed on Aug. 3, 2017, the entire contents of all of which are incorporated herein by reference.

An optoelectronic semiconductor component with a contact structure and a method for producing a contact structure for an optoelectronic semiconductor component are specified. The optoelectronic semiconductor component may in particular be a radiation-emitting or radiation-detecting optoelectronic semiconductor component which emits or detects electromagnetic radiation, for example light, during operation.

A task to be solved is to specify a Method for producing a contact structure for an optoelectronic semiconductor component which allows a simplified production.

Another task is to specify an optoelectronic semiconductor component with a contact structure.

According to at least one embodiment of the method for producing a contact structure for an optoelectronic semiconductor component, the method for production comprises the steps a) to f) described in the following:

a) providing a growth substrate with a semiconductor body which is grown thereon and comprises a first region, a second region and an active region suitable for generating or detecting electromagnetic radiation, wherein the first region is arranged between the growth substrate and the active region, and wherein the active region is arranged between the first region and the second region.

The growth substrate may be formed with, for example, a gallium arsenide or sapphire. The regions of the semiconductor body are preferably grown epitaxially on the growth substrate. The active region preferably comprises a pn junction, a double heterostructure, a single quantum well (SQW) or, especially preferred, a multi quantum well (MQW) structure for radiation generation or detection.

b) generating at least one first recess which, starting from the second region, extends completely through the active region into the first region and does not completely penetrate the first region.

This first recess may, for example, have the shape of a cylinder, a cone, a truncated cone, a truncated pyramid or a pyramid. The first recess can be produced by a plasma etching process, for example. The side walls of the first recess can have a positive flank angle with respect to the etching direction during an etching process, resulting in a tapered, for example conical, shape. The requirements for controlling the etching depth are advantageously reduced, since the etching only has to stop within the first region of the semiconductor body, but not necessarily at one of its interfaces.

c) introduction of a first electrically conductive contact material into the first recess.

This first electrically conductive contact material can be formed with a metal or a metal alloy, for example, and can be deposited galvanically, for example.

d) fixing the semiconductor body with the side of the semiconductor body facing away from the growth substrate on a support substrate and detaching the growth substrate from the semiconductor body.

Fixing the semiconductor body to a support substrate may be accomplished, for example, by a soldering process. The support substrate is based on silicon, for example. The growth substrate can be detached by means of a laser lift-off process. It is also possible to thin the growth substrate by means of a polishing process and then remove it by means of an etching process.

e) creating at least one second recess extending from the first region to the first recess so that the first recess and the second recess form a feedthrough through the semiconductor body.

The second recess can be created by means of a plasma etching process, for example. During an etching process, the side walls of the second recess may have a positive flank angle with respect to the etching direction, resulting in a tapered, for example conical, shape. The requirements for controlling the etching depth are advantageously reduced, since the etching only has to extend to the first recess within the first region of the semiconductor body, but does not necessarily have to stop at this interface. Thus even a slight over-etching of the interface of the first recess is tolerable.

f) introducing a second electrically conductive contact material into the second recess in such a way that the first contact material and the second contact material form an electrically conductive path through the semiconductor body.

This means that the first contact material and the second contact material are electrically conductively connected to each other. A current flow from the first contact material into the second contact material is possible.

According to at least one embodiment of the method for producing a contact structure for an optoelectronic semiconductor component, the method comprises the steps:

a) providing a growth substrate with a semiconductor body which is grown thereon and comprises a first region, a second region and an active region suitable for generating or detecting electromagnetic radiation, wherein the first region is disposed between the growth substrate and the active region, and wherein the active region is disposed between the first region and the second region, b) creating at least one first recess which, starting from the second region, extends completely through the active region into the first region and does not completely penetrate the first region, c) inserting a first electrically conductive contact material into the first recess, d) fixing the semiconductor body with the side of the semiconductor body facing away from the growth substrate on a support substrate, and detaching the growth substrate from the semiconductor body, e) creating at least one second recess extending from the first region to the first recess such that the first recess and the second recess form a feedthrough through the semiconductor body, f) introducing a second electrically conductive contact material into the second recess such that the first contact material and the second contact material form an electrically conductive path through the semiconductor body.

A method described here for producing a contact structure for an optoelectronic semiconductor body is based, among other things, on the consideration that, when producing a contact structure, it is comparatively costly to precisely control the depth of an etching process. Until now, it has been necessary to stop the etching process at an exactly defined depth in order to achieve optimum contacting.

The method described here for producing a contact structure now makes use of the idea of dividing the production of the contact structure into two etching processes, each from opposite sides of a semiconductor body. Since in a first etching process only the second region and the active region have to be broken through and stopped within the first region, the tolerance is advantageously extended to the entire thickness of the first region. The second etch to create the contact structure is performed from the opposite side of the first etch and only has to open the semiconductor body up to the first etch. This process also has the advantage that it does not place high demands on the exact determination of the etching depth, as even a slight over-etching can be tolerated.

According to at least one embodiment of the method for producing a contact structure for an optoelectronic semiconductor component, the process comprises a process step e), in which the second recess is formed up to at least one marking layer arranged in the first region. This means that a marking layer is provided within the first region of the semiconductor body, which has a known dopant ratio and it can thus be recognized when this layer is reached, for example in a plasma etching process, by means of the spectrum of the plasma. This layer thus serves as a marker for a certain etching depth. This makes it possible to determine the etching depth exactly in a plasma etching process by continuously observing the spectrum of the plasma of the etched products. This results in advantageously increased control over the etching depth.

According to at least one embodiment of the method for producing a contact structure for an optoelectronic semiconductor component, an electrically insulating, preferably dielectric layer is introduced into the first recess between method steps b) and c), which is partially removed between method steps e) and f), so that the first contact material is partially exposed. The electrically insulating, preferably dielectric layer can, for example, consist of a silicon oxide. A plasma-enhanced Chemical Vapour Deposition (PECVD) process is suitable for the production of the electrically insulating layer, whereby a more complex tetraethylorthosilicate (TEOS) process can be avoided. By introducing the electrically insulating layer, a short circuit between the first region, the active layer and the second region of the semiconductor body can be avoided.

According to at least one embodiment of the method for producing a contact structure for an optoelectronic semiconductor component, the electrically insulating, preferably dielectric layer is introduced into the first recess by means of a high-temperature process step. This means that the preferably dielectric layer of, for example, a silicon oxide can be grown onto the surface of the first recess by a high-temperature process step. For this purpose, it is advantageous if the wafer has not yet been bonded to its final substrate and no metallic connection layers are present. This is advantageous to avoid metal diffusion or detachment of the wafer from the later substrate.

According to at least one embodiment of the method for producing a contact structure for an optoelectronic semiconductor component, the first contact material and the second contact material have the same composition. This means, for example, that the first contact material and the second contact material are formed from the same metal or metal alloy.

According to at least one embodiment of the method for producing a contact structure for an optoelectronic semiconductor component, the first recess tapers from the second region towards the first region and/or the second recess tapers from the first region towards the second region. In other words, the first and second recesses taper towards the center of the semiconductor body. In other words, the cross-sectional area parallel to the main plane of extension of the semiconductor body of the contact structure has a minimum area within the semiconductor body. For example, the first and second recesses have the shape of a cone, a truncated cone, a truncated pyramid or a pyramid.

According to at least one embodiment of the method for producing a contact structure for an optoelectronic semiconductor component, the semiconductor body is based on a gallium phosphide-, an aluminum phosphide-, an indium phosphide-, a gallium aluminum phosphide-, a gallium indium phosphide-, an indium aluminum phosphide- or a gallium aluminum indium phosphide-compound semiconductor material or on a gallium arsenide-, an aluminum arsenide-, an indium arsenide-, a gallium aluminum arsenide-, a gallium indium arsenide-, an indium aluminum arsenide- or a gallium aluminum indium arsenide-compound semiconductor material.

"Based on phosphide-compound semiconductor material" in this context means that the semiconductor body or regions of the semiconductor body preferably comprise $Al_n Ga_m In_{1-n-m} P$ or $As_n Ga_m In_{1-n-m} P$, where $0 \leq n \leq 1$, $0 \leq m \leq 1$ and $n+m \leq 1$. This material does not necessarily have to have a mathematically exact composition according to the above formula. Rather, it may comprise one or more dopants and additional components. For simplicity's sake, however, the above formula only includes the essential components of the crystal lattice (Al or As, Ga, In, P), even though these may be partially replaced by small amounts of other substances.

"Based on arsenide-compound semiconductor material" in this context means that the semiconductor body or regions of the semiconductor body preferably comprise $Al_n Ga_m In_{1-n-m} As$, where $0 \leq n \leq 1$, $0 \leq m \leq 1$ and $n+m \leq 1$. This material does not necessarily have to have a mathematically exact composition according to the above formula. Rather, it may comprise one or more dopants and additional components. For simplicity's sake, however, the above formula only includes the essential components of the crystal lattice (Al or As, Ga, In), even though these may be partially replaced by small amounts of other substances.

According to at least one embodiment of the optoelectronic semiconductor component with a contact structure, the optoelectronic semiconductor component has a semiconductor body with a first region, an active region suitable for generating or detecting electromagnetic radiation and a second region and a main plane of extension, the first region being located in a direction perpendicular to the main plane of extension, the active region and the second region follow one another, the contact structure in the semiconductor body has at least one feedthrough extending from the first region to the second region and penetrating the active region, in which feedthrough a contact material is arranged, and the feedthrough has a cross-section parallel to the main plane of extension, the area of which varies from the first region to the second region and has a minimum within the semiconductor body. In particular, the semiconductor body has a plurality of feedthroughs which are separated from one another. In other words, the feedthroughs represent in particular a plurality of recesses in the semiconductor body which extend from the first region to the second region and penetrate the active region, wherein the feedthroughs do not touch each other.

The main plane of extension is transverse, preferably perpendicular to the stacking direction of the semiconductor body. The regions of the semiconductor body are preferably grown epitaxially on the growth substrate. The active region preferably comprises a pn junction, a double heterostructure, a single quantum well (SQW) or, particularly preferred, a multi quantum well (MQW) structure for radiation generation.

According to at least one embodiment of the optoelectronic semiconductor component with a contact structure, an electrically insulating, preferably dielectric layer is arranged in the feedthrough between the contact material and the adjacent semiconductor body. This layer can be formed with a silicon oxide, for example. This electrically insulating, preferably dielectric layer serves to avoid direct electrical contact between the contact material and the adjacent regions of the semiconductor body. This can be advantageous in preventing a current flow and thus a short circuit between the first region and the second region via the contact material.

According to at least one embodiment of the optoelectronic semiconductor component with a contact structure, the at least one feedthrough on the side of the first region remote from the active region has a cross-section parallel to the main plane of extension with a first surface area, and on the side of the second region remote from the active region has a cross-section parallel to the main plane of extension with a second surface area, the first surface area deviating from the second surface area. This means that the first and the second recess can be designed with different diameters. This can be an advantage in a plasma etching process, for example. A sufficiently large second recess amplifies the available plasma signal, which facilitates or improves the detection of the etching depth. At the same time, the diameter of the first recess can be kept small in order to keep the area of the active region disturbed by the recess as small as possible.

According to at least one embodiment of the optoelectronic semiconductor component with a contact structure, the feedthrough on the side of the first region and/or the second region has a conically shaped partial region. In other words, the feedthrough is composed, for example, of two cones, truncated cones, pyramids or truncated pyramids standing on top of each other with their pointed ends. A minimum of the cross-sectional area of the contact structure is thus within the semiconductor body.

According to at least one embodiment of the optoelectronic semiconductor component with a contact structure, in which the feedthrough on the side of the first region and the second region each has a conically shaped partial region, the conically shaped partial regions are axially aligned with one another. This means that the partial regions have a common axis of symmetry and are not axially offset from one another. This results in the widest possible overlap of the partial regions and an advantageously high current carrying capacity of the contact structure.

According to at least one embodiment of the optoelectronic semiconductor component with a contact structure, the semiconductor body is based on a gallium phosphide-, an aluminum phosphide-, an indium phosphide-, a gallium aluminum phosphide-, a gallium indium phosphide-, an indium aluminum phosphide- or a gallium aluminum indium phosphide-compound semiconductor material or on a gallium arsenide-, an aluminum arsenide-, an indium arsenide-, a gallium aluminum arsenide-, a gallium indium arsenide-, an indium aluminum arsenide- or a gallium aluminum indium arsenide-compound semiconductor material in the sense defined above Further advantages and advantageous embodiments and further developments of the optoelectronic semiconductor component with a contact structure result from the following exemplary embodiments, which are shown in connection with the figures.

Figure 1F:
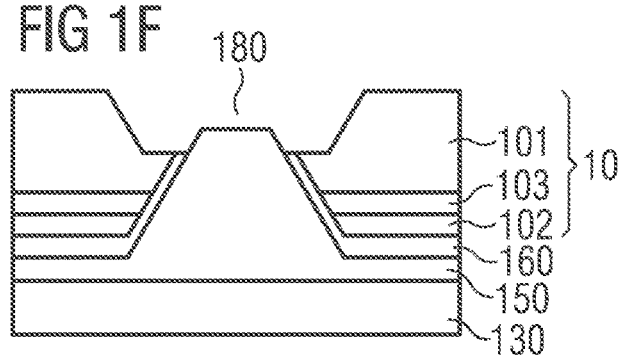
Figure 1G:
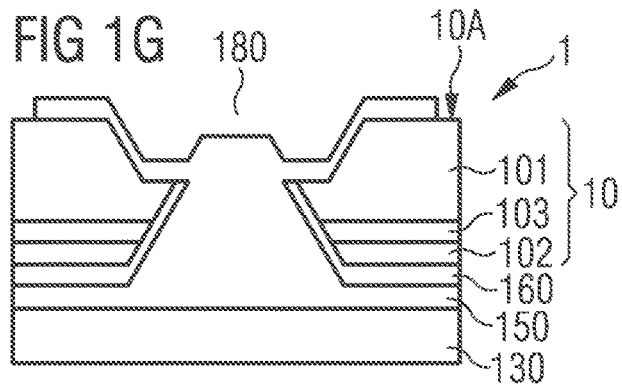
Figure 2:
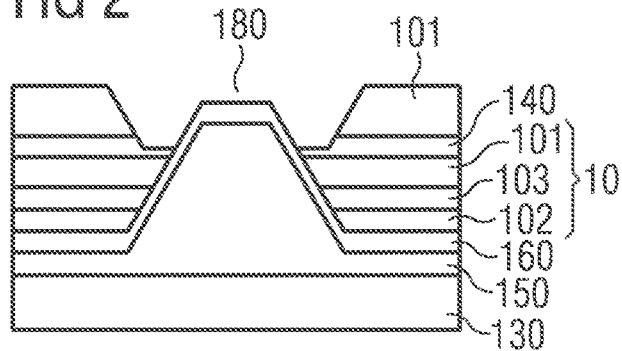

Showing in:

FIGS. 1A to 1G schematic cross-sections through an optoelectronic semiconductor component with a contact structure at different steps of a method of its production according to a first exemplary embodiment, and FIG. 2 a schematic cross-section through an optoelectronic semiconductor component according to a second exemplary embodiment.

Identical, similar or similar acting elements are provided with the same reference signs in the figures. The figures and the proportions of the elements represented in the figures are not to be regarded as true to scale. Rather, individual elements may be shown in an excessively large size for better representability and/or for better comprehensibility.

FIG. 1A shows a first step of a method for producing a contact structure 150 for an optoelectronic semiconductor component 1 according to a first exemplary embodiment. The optoelectronic device 1 comprises a semiconductor body 10 composed of a first region 101, a second region 102 and an active region 103. The semiconductor body 10 is epitaxially grown on a growth substrate 120. The first region 101 is preferably n-doped and the second region 102 is preferably p-doped. The active region 103 has a pn junction with a multiple quantum well structure and is designed to generate electromagnetic radiation.

FIG. 1B shows a further step of a method for producing a contact structure 150 for an optoelectronic semiconductor component 1 according to the first exemplary embodiment. In this step, a first recess 170 is introduced in the semiconductor body 10 starting from the second region 102 and extending into the first region 101. This first recess 170 can be made by means of a plasma etching process, for example. The first recess 170 has the conical shape of a truncated cone, which tapers from the second region 102 towards the first region 101 of the semiconductor body 10.

FIG. 1C shows a further step of a method for producing a contact structure 150 for an optoelectronic semiconductor component 1 according to the first exemplary embodiment. In this step, an electrically insulating layer 160 is deposited on the side of the second region 102 facing away from the growth substrate 120 and in the first recess 170. The electrically insulating layer 160 is formed with a silicon oxide, for example.

FIG. 1D shows a further step of a method for producing a contact structure 150 for an optoelectronic semiconductor component 1 according to the first exemplary embodiment. An electrical contact structure 150 is inserted into the first recess 170. The contact structure 150 can, for example, be formed with a metal and be deposited galvanically. After inserting the contact structure 150, the semiconductor body 10 can be mounted on the support substrate 130. This can be done by means of a soldering process, for example. Subsequently, the growth substrate 120 can be detached from the semiconductor body 10. The removal of the growth substrate 120 can be done for example by a laser lift-off process or by polishing and subsequent etching of the growth substrate 120.

FIG. 1E shows a further step of a method for producing a contact structure 150 for an optoelectronic semiconductor component 1 according to the first exemplary embodiment. In this step, a second recess 180 is inserted into the semiconductor body 10 from the side opposite the first recess 170. This second recess 180 is located entirely within the first region 101. The second recess 180 has the shape of a truncated cone which tapers from the first region 101 towards the second region 102. The second recess 180 extends within the first region 101 to the contact structure 150 and is adjacent to the contact structure 150. In the direction of the normal vector of the main plane of extension of the semiconductor body 10, the second recess 180 is aligned with the first recess 170. The cross-sectional area of the second recess 180 in a cross-section parallel to the main plane of extension on the side of the first region 101 remote from the active region 103 corresponds to the cross-sectional area of the first recess 170 in a cross-section parallel to the main plane of extension on the side of the second region 102 remote from the active region 103.

FIG. 1F shows a further step of a method for producing a contact structure 150 for an optoelectronic semiconductor component 1 according to the first exemplary embodiment. In this step the electrically insulating layer 160 within the second recess 180 is opened. This can be done by means of an etching process, for example. This exposes the contact structure 150 in the second recess 180.

FIG. 1G shows a further step of a method for producing a contact structure 150 for an optoelectronic semiconductor component 1 according to the first exemplary embodiment. In this step, a second part of the electrical contact structure 150 is applied within the second recess 180. The second part of the electrical contact structure 150 directly adjoins the first part of the electrical contact structure 150. This means that the first part and the second part of the electrical contact structure 150 are electrically connected to each other and a current flow from the first part of the electrical contact structure 150 into the second part of the electrical contact structure 150 is possible. The surface of the first region 101 facing away from the active region 103 is set up as a radiation exit surface 10A, through which at least part of the electromagnetic radiation generated in the active region 103 during operation of the optoelectronic semiconductor component 1 leaves the semiconductor body 10.

FIG. 2 shows a further exemplary embodiment of a method for producing a contact structure 150 for an optoelectronic semiconductor component 1 according to a second exemplary embodiment. With the exception of an additional marking layer 140, the second exemplary embodiment corresponds to the step of the first exemplary embodiment shown in FIG. 1E.

The marking layer 140 is located within the first region 101 and is composed of a known, characteristic dopant combination. For example, the marking layer 140 has a composition of In50% (Ga10% Al90%)50% P or In50% (Ga5% Al45%)P.

Thus, in a plasma etching process, by continuously observing the spectrum of the etching plasma, an exact detection of this marking layer 140 and thus a determination of the etching depth is possible. In this exemplary embodiment, the second recess 180 extends only up to marking layer 140 and stops within the marking layer 140.

The invention is not limited by the description based on the exemplary embodiments. Rather, the invention comprises each new feature as well as each combination of features, which in particular includes each combination of features in the claims, even if this feature or combination itself is not explicitly stated in the claims or exemplary embodiments.

This patent application claims the priority of the German patent application 102017117650.0, the disclosure content of which is hereby incorporated by reference.

The invention claimed is:

1. Method for producing a contact structure for an optoelectronic semiconductor component, comprising the steps:
    a) providing a growth substrate with a semiconductor body which is grown thereon and comprises a first region, a second region and an active region suitable for generating or detecting electromagnetic radiation, wherein the first region is arranged between the growth substrate and the active region, and wherein the active region is arranged between the first region and the second region,
    b) creating a first recess which, starting from the second region, extends completely through the active region into the first region and does not completely penetrate the first region, wherein the first recess has the shape of a cone, truncated cone, pyramid or truncated pyramid, and the first recess on the side of the first region remote from the active region has a cross-section parallel to a main plane of extension with a first surface area,
    c) inserting a first electrically conductive contact material into the first recess,
    d) fixing the semiconductor body with the side of the semiconductor body facing away from the growth substrate on a support substrate, and detaching the growth substrate from the semiconductor body,
    e) creating a second recess which has the shape of a cone, a truncated cone, a pyramid or a truncated pyramid and which extends from the first region to the first recess so that the first recess and the second recess form a feedthrough through the semiconductor body, wherein the second recess on the side of the second region remote from the active region, has a cross-section parallel to the main plane of extension with a second surface area, the first surface area being smaller than the second surface area,
    f) introducing a second electrically conductive contact material into the second recess such that the first contact material and the second contact material form an electrically conductive contact structure through the semiconductor body, whereby
    in method step e) the second recess is formed up to at least one marking layer which has a known dopant ratio and is arranged within the first region.

2. Method for producing a contact structure for an optoelectronic semiconductor component according to claim 1, in which
    between process steps b) and c) an electrically insulating layer is introduced into the first recess, which is partially removed between process steps e) and f), so that the first contact material is partially exposed.

3. Method for producing a contact structure for an optoelectronic semiconductor component according to claim 1, in which
    the first contact material and the second contact material have the same composition.

4. Method for producing a contact structure for an optoelectronic semiconductor component according to claim 1, in which
    the first recess tapers from the second region towards the first region, and/or the second recess tapers from the first region towards the second region.

5. Method for producing a contact structure for an optoelectronic semiconductor component according to claim 1, in which
the semiconductor body is based on a gallium phosphide-, an aluminum phosphide-, an indium phosphide-, a gallium aluminum phosphide-, a gallium indium phosphide-, an indium aluminum phosphide- or a gallium aluminum indium phosphide-compound semiconductor material or on a gallium arsenide-, an aluminum arsenide-, an indium arsenide-, a gallium aluminum arsenide-, a gallium indium arsenide-, an indium aluminum arsenide- or a gallium aluminum indium arsenide-compound semiconductor material.

6. Method for producing a contact structure for an optoelectronic semiconductor component according to claim 2, in which
the electrically insulating layer comprises a dielectric layer.

7. Optoelectronic semiconductor component having a contact structure, comprising a semiconductor body with a first region, a second region and an active region suitable for generating or detecting electromagnetic radiation, and a main plane of extension, wherein
in a direction perpendicular to the main plane of extension, the first region, the active region and the second region follow each other,
the contact structure comprises a feedthrough in the semiconductor body extending from the first region to the second region and penetrating the active region, in which feedthrough a contact material is arranged,
the feedthrough has a cross-section parallel to the main plane of extension, the area of which varies from the first region to the second region and has a minimum within the semiconductor body, and wherein the feedthrough comprises a tapered partial region on the side of the first region and/or of the second region, and
a marking layer which has a known dopant ratio is arranged within the first region, and
the feedthrough on the side of the first region remote from the active region has a cross-section parallel to the main plane of extension with a first surface area and on the side of the second region remote from the active region has a cross-section parallel to the main plane of extension with a second surface area, the first surface area being smaller than the second surface area.

8. Optoelectronic semiconductor component with a contact structure according to claim 7, in which
an electrically insulating, preferably dielectric layer is arranged in the feedthrough between the contact material and the adjacent semiconductor body.

9. Optoelectronic semiconductor component with a contact structure according to claim 7, in which
the feedthrough on the side of the first region and the second region each has a conically shaped partial region and the conically shaped partial regions are axially aligned with one another.

10. Optoelectronic semiconductor component with a contact structure according to claim 7, wherein
the semiconductor body is based on a gallium phosphide-, an aluminum phosphide-, an indium phosphide-, a gallium aluminum phosphide-, a gallium indium phosphide-, an indium aluminum phosphide- or a gallium aluminum indium phosphide-compound semiconductor material or on a gallium arsenide-, an aluminum arsenide-, an indium arsenide-, a gallium aluminum arsenide-, a gallium indium arsenide-, an indium aluminum arsenide- or a gallium aluminum indium arsenide-compound semiconductor material.

11. Method for producing a contact structure for an optoelectronic semiconductor component according to claim 7, in which
the tapered partial region is conical or pyramid shaped.

12. Method for producing a contact structure for an optoelectronic semiconductor component, comprising the steps:
a) providing a growth substrate with a semiconductor body which is grown thereon and comprises a first region, a second region and an active region suitable for generating or detecting electromagnetic radiation, wherein the first region is arranged between the growth substrate and the active region, and wherein the active region is arranged between the first region and the second region,
b) creating a first recess which, starting from the second region, extends completely through the active region into the first region and does not completely penetrate the first region, wherein the first recess has the shape of a cone, truncated cone, pyramid or truncated pyramid,
c) inserting a first electrically conductive contact material into the first recess,
d) fixing the semiconductor body with the side of the semiconductor body facing away from the growth substrate on a support substrate, and detaching the growth substrate from the semiconductor body,
e) creating a second recess which has the shape of a cone, a truncated cone, a pyramid or a truncated pyramid and which extends from the first region to the first recess so that the first recess and the second recess form a feedthrough through the semiconductor body,
f) introducing a second electrically conductive contact material into the second recess such that the first contact material and the second contact material form an electrically conductive contact structure through the semiconductor body, whereby
in method step e) the second recess is formed up to at least one marking layer which has a known dopant ratio and is arranged within the first region, and whereby
in method step f) the second electrically conductive contact material is in direct contact with the first semiconductor material.

* * * * *